United States Patent
Zhang et al.

(10) Patent No.: US 10,861,921 B2
(45) Date of Patent: Dec. 8, 2020

(54) DISPLAY PANEL, DISPLAY DEVICE, AND MANUFACTURING METHOD OF DISPLAY PANEL

(71) Applicants: Chengdu BOE Optoelectronics Technology Co., Ltd., Sichuan (CN); BOE Technology Group Co., Ltd., Beijing (CN)

(72) Inventors: Bing Zhang, Beijing (CN); Qian Li, Beijing (CN)

(73) Assignees: CHENGDU BOE OPTOELECTRONICS TECHNOLOGY CO., LTD, Sichuan (CN); BOE TECHNOLOGY GROUP CO., LTD., Beijng (CN)

( * ) Notice: Subject to any disclaimer, the term of this patent is extended or adjusted under 35 U.S.C. 154(b) by 0 days.

(21) Appl. No.: 16/451,226

(22) Filed: Jun. 25, 2019

(65) Prior Publication Data

US 2020/0006456 A1    Jan. 2, 2020

(30) Foreign Application Priority Data

Jun. 28, 2018    (CN) .......................... 2018 1 0685254

(51) Int. Cl.
*H01L 27/32*    (2006.01)
*H01L 51/52*    (2006.01)
*H01L 51/56*    (2006.01)

(52) U.S. Cl.
CPC ...... *H01L 27/3272* (2013.01); *H01L 51/5203* (2013.01); *H01L 51/5271* (2013.01); *H01L 51/56* (2013.01)

(58) Field of Classification Search
CPC ........... H01L 2251/5315; H01L 27/322; H01L 27/3246; H01L 25/0753; H01L 27/3251;
(Continued)

(56) References Cited

U.S. PATENT DOCUMENTS

2005/0140275 A1*  6/2005  Park ...................... H01L 27/322
                                                      313/504
2009/0302760 A1* 12/2009  Tchakarov .............. B32B 17/06
                                                      313/512
(Continued)

FOREIGN PATENT DOCUMENTS

CN    201171239 Y    12/2008
CN    101930994 A    12/2010
(Continued)

OTHER PUBLICATIONS

First office action of Chinese application No. 201810685254.X dated Jan. 21, 2020.

*Primary Examiner* — Jonathan Han
(74) *Attorney, Agent, or Firm* — Fay Sharpe LLP

(57) ABSTRACT

The present disclosure discloses a display panel, a display device and a manufacturing method of a display panel, in the field of display technology. The display panel includes a plurality of light-emitting unit groups. A light-transmitting region is between every two adjacent light-emitting unit groups. Each light-emitting unit group includes a light-shielding layer and a light-emitting unit. According to the display panel provided in the present disclosure, light emitted by the light-emitting unit can be viewed from on one side, and light emitted by the light-emitting unit cannot be emitted from the other side due to shielding by the light-shielding layer. Since the light-transmitting region exists, the other side is still transparent. Thus, the display panel can be combined with varied transparent components, which diversifies function of the display panel.

19 Claims, 10 Drawing Sheets

(58) Field of Classification Search
CPC ............. H01L 27/3244; G02F 1/13454; G02F 1/133512; G02F 1/133514; G02F 1/133603; G02F 1/133553; G02F 2001/136222
USPC ............... 313/506, 504, 505, 500, 503, 483; 257/40, 88, 103, 89, 98; 428/690, 917, 428/332
See application file for complete search history.

(56) References Cited

U.S. PATENT DOCUMENTS

| | | | |
|---|---|---|---|
| 2015/0078033 A1* | 3/2015 | Lee | G02F 1/133609 362/609 |
| 2016/0226018 A1* | 8/2016 | Akagawa | H01L 51/5246 |
| 2017/0066968 A1* | 3/2017 | Lee | G02F 1/133512 |
| 2017/0161949 A1* | 6/2017 | Seder | B60R 1/001 |

FOREIGN PATENT DOCUMENTS

| | | |
|---|---|---|
| CN | 202503691 U | 10/2012 |
| CN | 104362169 A | 2/2015 |
| CN | 106653791 A | 5/2017 |
| CN | 107978236 A | 5/2018 |
| EP | 3026708 A1 | 6/2016 |

* cited by examiner

DISPLAY PANEL, DISPLAY DEVICE, AND MANUFACTURING METHOD OF DISPLAY PANEL

This application claims priority to Chinese Patent Application No.: 201810685254.X, filed on Jun. 28, 2018 and entitled "Information Display and Display Device", the entire contents of which are incorporated herein by reference.

The present disclosure relates to the field of display technology, and more particular to, a display panel, a display device, and manufacturing method for a display panel.

BACKGROUND

A display panel may include various devices for displaying information, e.g., a billboard, a station sign and a guidepost.

A display panel in the related art is a light emitting diode (LED) display screen, through which various information can be displayed. The LED display screen may be disposed on a car roof, a car body, the outer side of a mansion or the like.

SUMMARY

Embodiments of the present disclosure provide a display panel, a display device, and manufacturing method for a display panel. The technical solutions are as follows.

In an aspect, there is provided a display panel, comprising: a transparent base substrate; and a plurality of light-emitting unit groups, wherein the plurality of light-emitting unit groups is on the base substrate, a light-transmitting region is between every two adjacent light-emitting unit groups, each of the light-emitting unit groups comprises a light-shielding layer and at least one light-emitting unit, and an orthographic projection of the at least one light-emitting unit on the base substrate and an orthographic projection of the light-shielding layer on the base substrate have an overlapping region.

Optionally, the light-shielding layer is between the at least one light-emitting unit and the base substrate.

Optionally, the light-shielding layer is at a side, away from the base substrate, of the at least one light-emitting unit.

Optionally, the light-shielding layer is a reflective layer.

Optionally, each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material.

Optionally, in the first electrode and the second electrode, an electrode closer to the light-shielding layer adopts an integrated structure with the light-shielding layer.

Optionally, the orthographic projection of the at least one light-emitting unit on the base substrate is within the orthographic projection of the light-shielding layer on the base substrate.

Optionally, each of the light-emitting unit groups comprises at least three light-emitting units, and the at least three light-emitting units form a pixel structure.

Optionally, the plurality of light-emitting unit groups are uniformly disposed on the base substrate. Each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material and an electrode closer to the light-shielding layer adopts an integrated structure with the light-shielding layer, and the light-shielding layer is a reflective layer; the orthographic projection of the at least one light-emitting unit on the base substrate is within the orthographic projection of the light-shielding layer on the base substrate; and the light-shielding layer is between the at least one light-emitting unit and the base substrate.

In another aspect of the present disclosure, there is provided a display device, applied to a window of a vehicle and comprising two transparent cover plates and a display panel, wherein the display panel is between the two transparent cover plates and comprises a transparent base substrate and a plurality of light-emitting unit groups; wherein the plurality of light-emitting unit groups is on the base substrate, a light-transmitting region is between every two adjacent light-emitting unit groups, each of the light-emitting unit groups comprises a light-shielding layer and at least one light-emitting unit, and an orthographic projection of the at least one light-emitting unit on the base substrate and an orthographic projection of the light-shielding layer on the base substrate have an overlapping region.

Optionally, the display device is applied to a rear window of the vehicle, and a light-exiting direction of the display panel is towards the outside of the car.

Optionally, the display panel comprises a signal light region, and a light-emitting unit in the signal light region is configured to emit color light of a vehicle signal light.

Optionally, the signal light region comprises at least one signal sub-region, wherein each signal sub-region corresponds to one kind of vehicle signal light, and the light-emitting unit in any signal sub-region of the at least one signal sub-region is a light-emitting unit configured to emit color light of a vehicle signal light that the any signal sub-region corresponds to.

Optionally, each signal sub-region is provided with a passive drive component configured to drive the light-emitting unit in the signal sub-region.

Optionally, the display device is applied to a front window of the vehicle, and a light-exiting direction of the display panel is towards the inside of the car.

Optionally, the display device comprises a signal receiver, wherein the signal receiver is connected to the display panel and configured to receive a control signal and control the display panel based on the control signal.

Optionally, the display device is applied to a side window.

Optionally, sealant surrounding the display panel is disposed between the two transparent cover plates; and the display device comprises a dehumidifier in a region surrounded by the sealant.

Optionally, the plurality of light-emitting unit groups are uniformly disposed on the base substrate. In the display panel, each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material and an electrode closer to the light-shielding layer adopts an integrated structure with the light-shielding layer, and the light-shielding layer is a reflective layer; the orthographic projection of the at least one light-emitting unit on the base substrate is within the orthographic projection of the light-shielding layer on the base substrate; and the light-shielding layer is between the at least one light-emitting unit and the base substrate.

In yet another aspect of the present disclosure, there is provided a manufacturing method of a display panel, comprising: providing a transparent base substrate; providing a plurality of light-emitting unit groups, wherein each of the light-emitting unit groups comprises a light-shielding layer and at least one light-emitting unit; and disposing the plurality of light-emitting unit groups on the transparent base substrate, wherein a light-transmitting region is disposed between every two adjacent light-emitting unit groups, and an orthographic projection of the at least one light-emitting unit on the base substrate and an orthographic projection of the light-shielding layer on the base substrate have an overlapping region.

DETAILED DESCRIPTION

The embodiments of the present disclosure will be described below with reference to the accompanying drawings.

At present, display panels for varied purposes are emerging one after another, such as electronic information display boards by the roadside, information displays outside or at the tops of buildings, and electronic information display boards on vehicle bodies and car roofs. These display panels can be configured to display varied notice information or advertisement information.

However, these display panels have relatively single functions. Besides, display panels outside of buildings, on car bodies or car roofs may affect the aesthetic degree.

Figure 1:
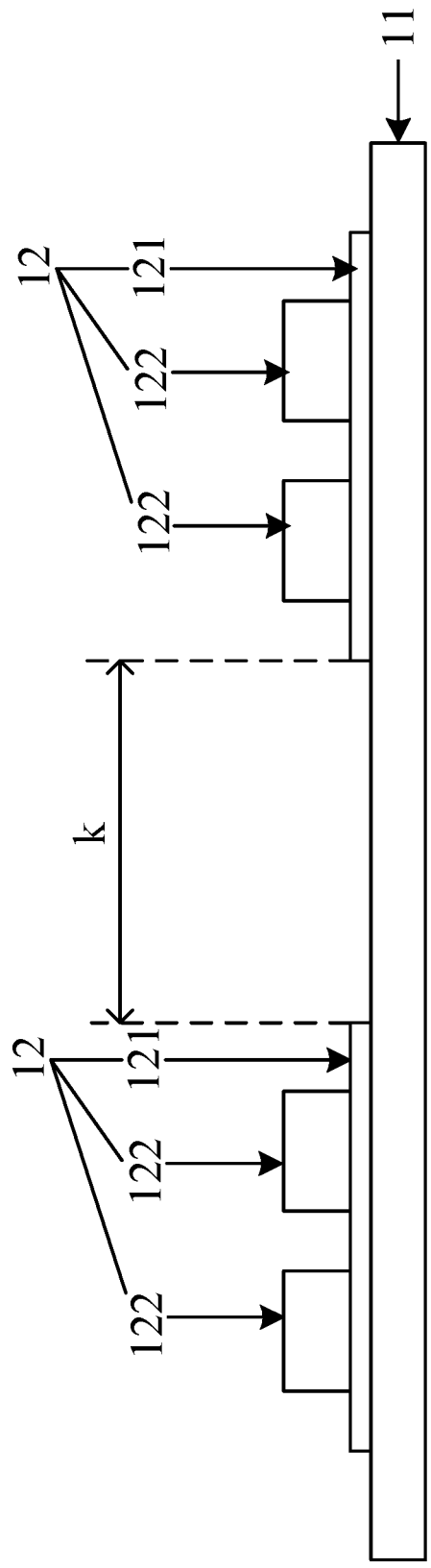
FIG. 1 is a schematic structural diagram of a display panel according to an embodiment of the present disclosure.

FIG. 1 is a schematic structural diagram of a display panel according to an embodiment of the present disclosure. The display panel 10 may include: a transparent base substrate 11, and a plurality of light-emitting unit groups 12 on the base substrate 11. A light-transmitting region k is disposed between every two adjacent light-emitting unit groups 12. Each light-emitting unit group 12 includes a light-shielding layer 121 and at least one light-emitting unit 122 (FIG. 1 illustrates a case where there are two the light-emitting units 122. However, there may also be one or even more light-emitting units 122, which is not limited in the embodiments of the present disclosure). An orthographic projection of the at least one light-emitting unit 122 on the base substrate 11 and an orthographic projection of the light-shielding layer 121 on the base substrate 11 have an overlapping region.

Here, light outside the display panel 10 can penetrate the display panel 10 through the transparent base substrate 11 and the light-transmitting region k. There may be no other structures, or some transparent structures (for example, a transparent protective layer, etc.) in the light-transmitting region k of the display panel 10.

In summary, according to the display panel provided in the embodiments of the present disclosure, light emitted by the light-emitting unit can be viewed from one side of the display panel, and light emitted by the light-emitting unit cannot be emitted from this side due to shielding by the light-shielding layer on the other side of the display panel. Since the light-transmitting region exists between the light-emitting unit groups, the other side of the display panel still has a transparent function. In this way, the display panel can be combined with varied transparent components. One side of the display panel plays a display function and the other side is transparent, which solves the problem of a relatively single function of the display panel in the related art, and diversifies the function of the display panel.

Figure 2:
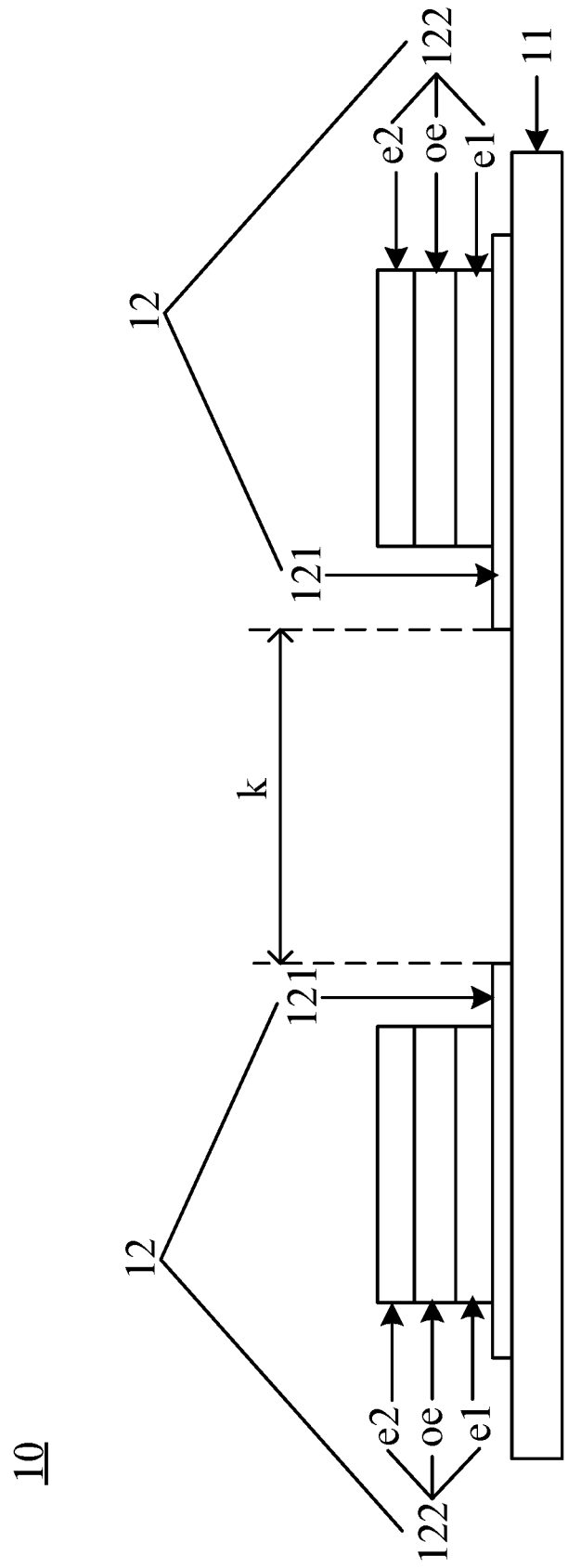
FIG. 2 is a schematic structural diagram of another display panel according to an embodiment of the present disclosure.

Optionally, referring to FIG. 2, it shows a schematic structural diagram of another display panel according to an embodiment of the present disclosure.

Optionally, each light-emitting unit 122 includes a first electrode e1, an organic light-emitting layer oe and a second electrode e2 which are sequentially disposed in a direction away from the base substrate 11. The organic light-emitting layer oe may be made from an organic light-emitting material. For different organic light-emitting materials, the light-emitting units 122 may emit light of different colors. Here, one of the first electrode e1 and the second electrode e2 is a cathode, and the other one is an anode. Exemplarily, the first electrode e1 is an anode and the second electrode e2 is a cathode.

The electrode at the side away from the light-shielding layer 121, of the organic light-emitting layer oe, is made from a transparent conductive material, which facilitate light emitted by the organic light-emitting layer oe to be emitted from the display panel. Here, the transparent conductive material may be Indium tin oxide (ITO).

Optionally, the light-shielding layer 121 is disposed between the at least one light-emitting unit 122 and the base substrate 11. The light-shielding layer 121 may be disposed on the base substrate 11 first, and then one or a plurality of light-emitting units 122 may be disposed on the light-shielding layer 121. The manufacturing process is relatively simple. FIG. 2 shows this structure (In this structure, the second electrode e2 is made from the transparent conductive material). The light-shielding layer may also be disposed at the side, away from the base substrate, of the at least one light-emitting unit 122, which is not limited in the embodiments of the present disclosure. Optionally, the light-shielding layer 121 may be a reflective layer, such that light emitted from the organic light-emitting layer oe to the light-shielding layer 121 may be reflected out of the display panel, which improves the overall light-emitting efficiency of the light-emitting unit.

In the display panel provided in the embodiments of the present disclosure, a plurality of light-emitting units 122 may form an organic light-emitting diode (OLED) display panel.

FIG. 2 illustrates a case where the first electrode e1 and the light-shielding layer 121 are two independent structures. Here, the first electrode e1 may be made from a transparent conductive material (the material may be the same as or different from the material of the second electrode e2) and may also be made from a non-transparent conductive material.

Optionally, the plurality of light-emitting unit groups 12 is uniformly arranged on the base substrate 11. For this structure, light transmittance of all regions of the display panel may be substantially the same. Thus, the transparent effect of the display panel is improved further.

Optionally, each light-emitting unit group 12 may include one light-emitting unit 122. That is, a light-transmitting region k is disposed between every two adjacent light-emitting units 122.

Figure 3:
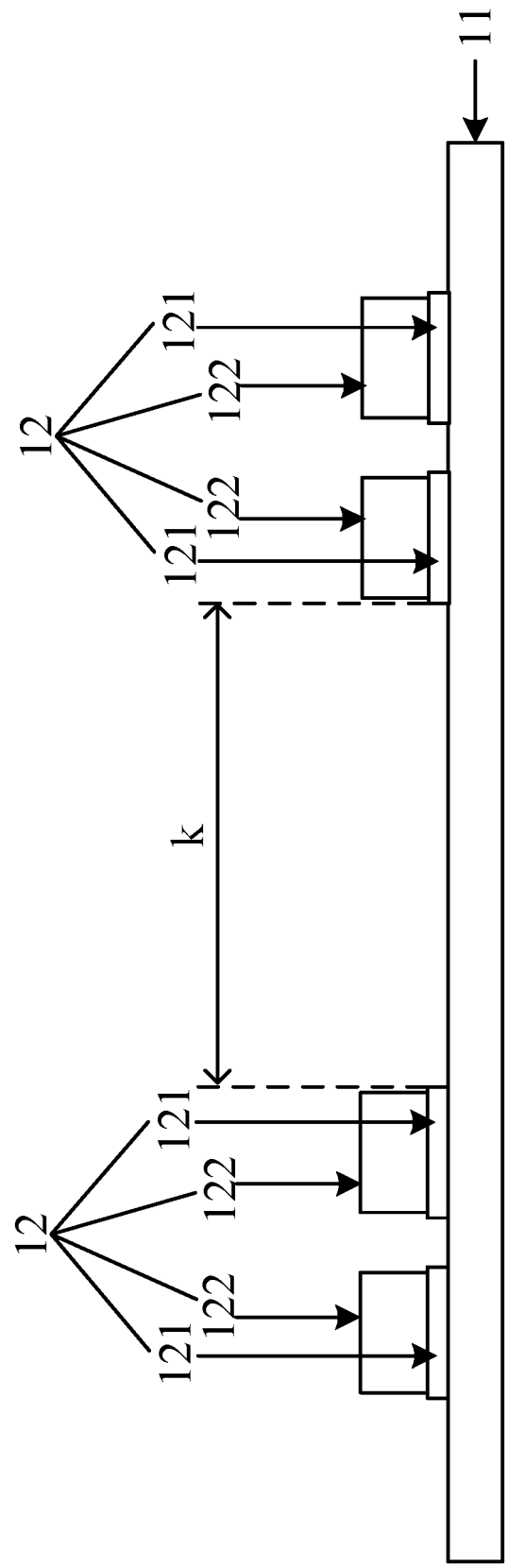
FIG. 3 is a schematic structural diagram of another display panel according to an embodiment of the present disclosure.

The light-shielding layer in each light-emitting unit group may be of a whole-layer structure (FIG. 1 illustrates this structure). Moreover, as shown in FIG. 3, which is a schematic structural view of another display panel according to an embodiment of the present disclosure, the light-shielding layer 121 in each light-emitting unit group 12 may be an independent light-shielding structure that corresponds to each light-emitting unit 122 respectively.

Optionally, an orthographic projection of the light-emitting unit 122 in each light-emitting unit group 12 on the base substrate 11 may be within an orthographic projection of the light-shielding layer 121 on the base substrate 11, to further avoid light emitted by the light-emitting unit from being emitted from the side, on which no light-emitting unit 122 is disposed, of the base substrate 11, thereby improving the transparent effect of the display panel.

In the embodiments of the present disclosure, the light-shielding layer in the light-emitting unit group may be configured to prevent light emitted by the light-emitting unit from being emitted from the side (this side can be referred to as a backlight side of the display panel), on which no light-emitting unit group is disposed, of the base substrate. Thus, regardless of whether the plurality of light-emitting unit groups on the base substrate is performing display, a viewer at the backlight side will not view the content displayed on the display panel, and thereby the viewer can view scenery at the other side of the display panel through the display panel without being influenced by the displayed content. When the plurality of light-emitting unit groups on the base substrate performs display, a viewer at the side (this side can be referred to as a light-exiting side of the display panel), away from the base substrate, of the light-emitting unit group can view the content displayed on the display panel. However, when the plurality of light-emitting unit groups on the base substrate does not display images, the viewer at the light-exiting side can still view scenery at the backlight side of the display panel through the display panel.

Therefore, for the viewer at the backlight side of the display panel, the display panel provided in the embodiment of the present disclosure is equivalent to traditional transparent glass, transparent plastic or other transparent objects. For the viewer at the light-exiting side of the display panel, the display panel provided in the embodiment of the present disclosure is equivalent to a display or a transparent object. Thus, the display panel provided in the embodiment of the present disclosure can be applied to varied scenarios where transparent objects are needed.

Exemplarily, the display panel provided in the embodiment of the present disclosure may replace glass (e.g., a glass window, a glass curtain wall or a glass wall) applied to the outside of a building, such that the viewer at the backlight side of the display panel (i.e., a viewer inside the building) can still normally view scenery at the outer side of the display panel (i.e., the outer side of the building). The viewer at the outer side of the display panel (i.e., observer viewer outside the building) can also view varied information displayed on the light-exiting side of the display panel. In addition, when the display panel does not perform display, the display panel is equivalent to conventional transparent glass in the eyes of the viewer. Compared with technical solutions that other display devices are independently disposed outside the building additionally, the technical solution in the present disclosure not only simplifies the process of disposing a display device outside the building, but also improves the aesthetic degree of the outside of the building (the display device additionally disposed outside the building may affect the aesthetic degree of the appearance of the building).

In addition, the display panel provided in the embodiments of the present disclosure may also replace glass in other scenarios where glass is used, which is not limited in the embodiments of the present disclosure.

Figure 4:
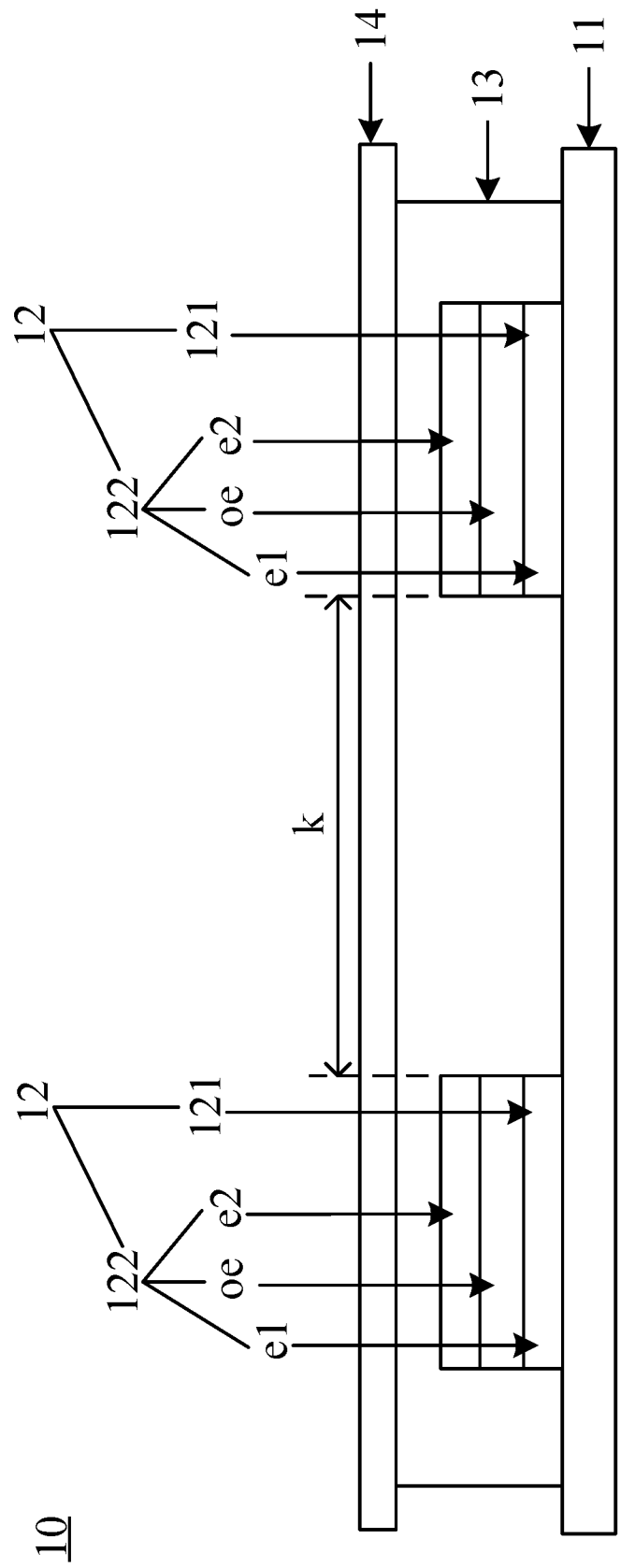
FIG. 4 is a schematic structural diagram of another display panel according to an embodiment of the present disclosure.

Optionally, referring to FIG. 4, it is a schematic structural diagram of yet another display panel according to an embodiment of the present disclosure. In the first electrode e1 and the second electrode e2, the electrode at the side, close to the light-shielding layer 121, of the organic light-emitting layer oe adopts an integrated structure with the light-shielding layer 121. FIG. 4 illustrates a case where the first electrode e1 and the light-shielding layer 121 adopt an integrated structure. That is, the first electrode e1 may be made from a light-shielding conductive material, for example, a metal material with relatively high reflectivity. Thus, not only the thickness of the display panel can be reduced, but also the structure of the display panel can be simplified.

Optionally, the display panel may further include a light lead-out layer 13 and an encapsulation layer 14. The light lead-out layer 13 is configured to guide light emitted by the light-emitting unit 122 out of the display panel. The encapsulation layer 14 is configured to protect varied structures in the display panel. The encapsulation layer 14 may be a structural layer formed by a thin film encapsulation (TFE) process.

Optionally, the light-emitting unit in the display panel provided in the embodiment of the present disclosure may be driven by means of active driving or passive driving, or both of the two. When active driving is adopted, the display panel may further include a TFT array through which each light-emitting unit can be independently controlled. An orthographic projection of the TFT array on the base substrate and an orthographic projection of the light-transmitting region on the base substrate may have no overlapping region, to avoid the TFT array from affecting the transparency of the display panel.

Figure 5:
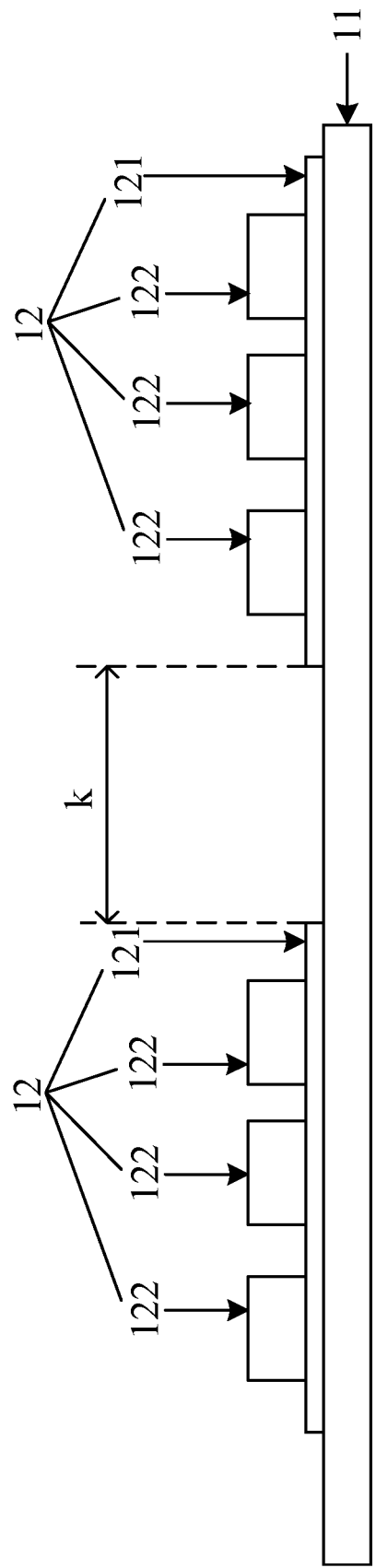
FIG. 5 is a schematic structural diagram of another display panel according to an embodiment of the present disclosure.

Optionally, referring to FIG. 5, it is a schematic structural diagram of yet another display panel according to an embodiment of the present disclosure. Each light-emitting unit group 12 includes at least three light-emitting units 122 (FIG. 5 illustrates a case where the light-emitting unit group includes three light-emitting units. However, there may be more light-emitting units, which is not limited in the embodiment of the present disclosure). The at least three light-emitting units 122 form a pixel structure.

The pixel structure is a structure configured to display one kind of color in the display panel. Each pixel structure may include at least three light-emitting units, i.e., a light-emitting unit configured to emit red light, a light-emitting unit configured to emit green light and a light-emitting unit configured to emit blue light. The pixel structure can emit light of varied colors through different proportions of three primary light (i.e., red light, green light and blue light).

In summary, according to the display panel provided in the embodiments of the present disclosure, light emitted by the light-emitting unit can be viewed from one side of the display panel, and light emitted by the light-emitting unit cannot be emitted from this side due to shielding by the light-shielding layer. Since a light-transmitting region exists between the light-emitting unit groups, the other side of the display panel still has a transparent function. In this way, the display panel can be combined with varied transparent components. One side of the display panel plays a display function and the other side of the display panel is transparent, which solves the problem of a relatively single function of the display panel in the related art and diversifies the function the display panel.

Figure 6:
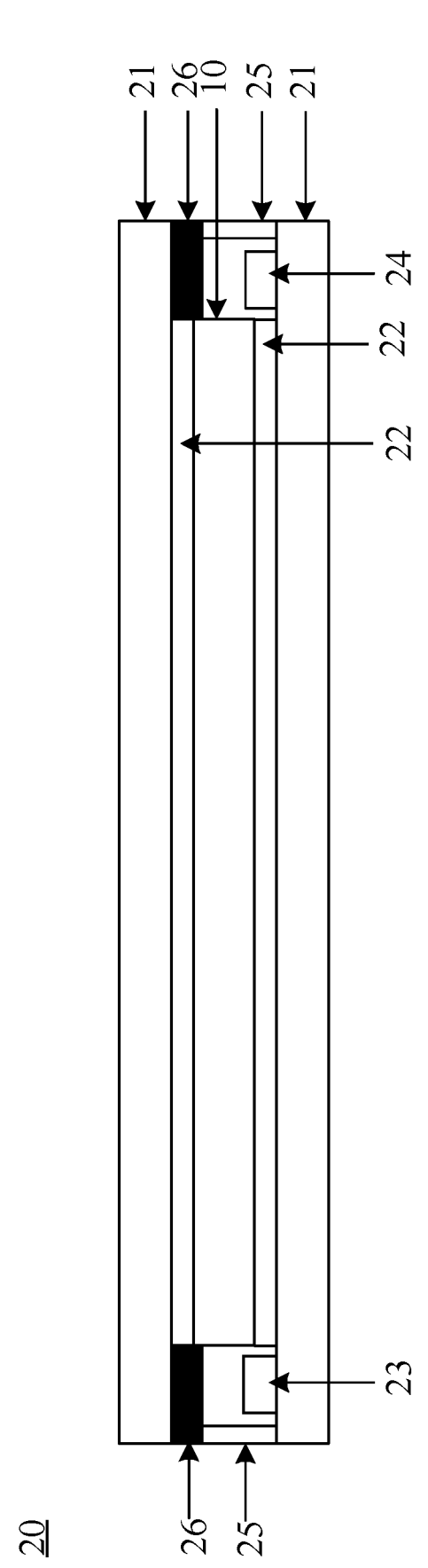
FIG. 6 is a schematic structural diagram of a display device according to an embodiment of the present disclosure.

FIG. 6 is a schematic structural diagram of a display device according to an embodiment of the present disclosure. The display device is applied to a window of a vehicle (the car vehicle include a front window, a rear window, a side window, a roof window, etc.), and includes two transparent cover plates 21 and any of the display panels provided in the above-described embodiments. The display panel 10 is between two transparent cover plates 21.

Optionally, the display panel 10 may be bonded to two transparent cover plates 21 respectively by optically clear adhesive (OCA) 22.

Optionally, the display device 20 further includes a signal receiver 23 connected to the display panel 10. The signal receiver 23 is configured to receive a control signal in a wired or wireless manner and control the display panel 10 to display based on the control signal. The control signal may be varied broadcast signals (for example, a broadcast signal sent by a media operation company) received by the signal receiver 23 in a wireless manner, and may also be a signal which is sent by a controller in a vehicle car and received by the signal receiver 23 in a wired or wireless manner and. The signal receiver 23 may be at the edge of the display device 20.

Optionally, a sealant 25 surrounding the display panel 10 is further disposed between the two transparent cover plates 21. The sealant 25 may be UV-curing adhesive (US adhesive for short). The sealant 25 can prevent the display panel from being in direct contact with external environment, thereby achieve the effects of protecting the display panel and prolonging the service life of the display panel.

Optionally, the display device includes a dehumidifier 24 in a region surrounded by the sealant 25. Humid environment may affect the service life of the display panel 10 (Particularly, when the display panel 10 contains an organic light-emitting material, humid environment may severely affect the service life of the organic light-emitting material). The dehumidifier 24 can reduce the humidity in the environment (namely, a cavity enclosed by the two transparent cover plates 21 and the sealant 25) in which the display panel 10 is, thereby prolonging the service life of the display panel 10. The dehumidifier 24 may be varied kinds of dehumidifiers, for example, a dryer or semiconductor chip low-temperature dehumidifier. The dehumidifier 24 may be disposed at an edge of the display device 20.

Optionally, in the display device 20, a shielding block 26 may further be disposed at the edge, close to the outside of the vehicle, of the transparent cover plate. The shielding block 26 is configured to shield at least one of the dehumidifier 24 and the signal receiver 23 at the edge of the display device 20, to improve the aesthetic degree of the display device 20. The shielding block 26 may be formed by dark (for example, black) ink.

Figure 7:
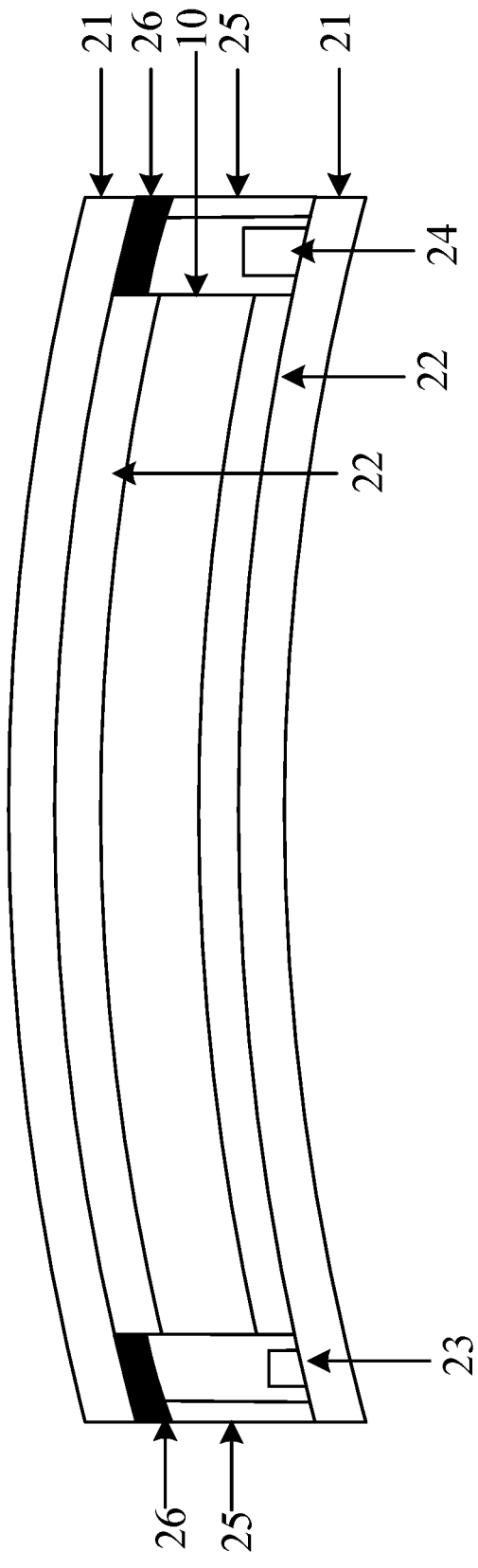
FIG. 7 is a schematic structural diagram of another display device according to an embodiment of the present disclosure.

FIG. 6 illustrates a schematic structural diagram of a display device in a tabulate shape. However, the window of a vehicle usually has a certain radian. Referring to FIG. 7, it is a schematic structural diagram of a display device with a certain radian. Here, the shielding block 26 and the optically clear adhesive 22 may have no overlapping region (FIG. 5 and FIG. 6 shows this circumstance), or the shielding block 26 and the optically clear adhesive 22 may have an overlapping region. Reference may be made to FIG. 5 for the meanings of other reference numerals in FIG. 6, which are not repeated herein.

Figure 8:
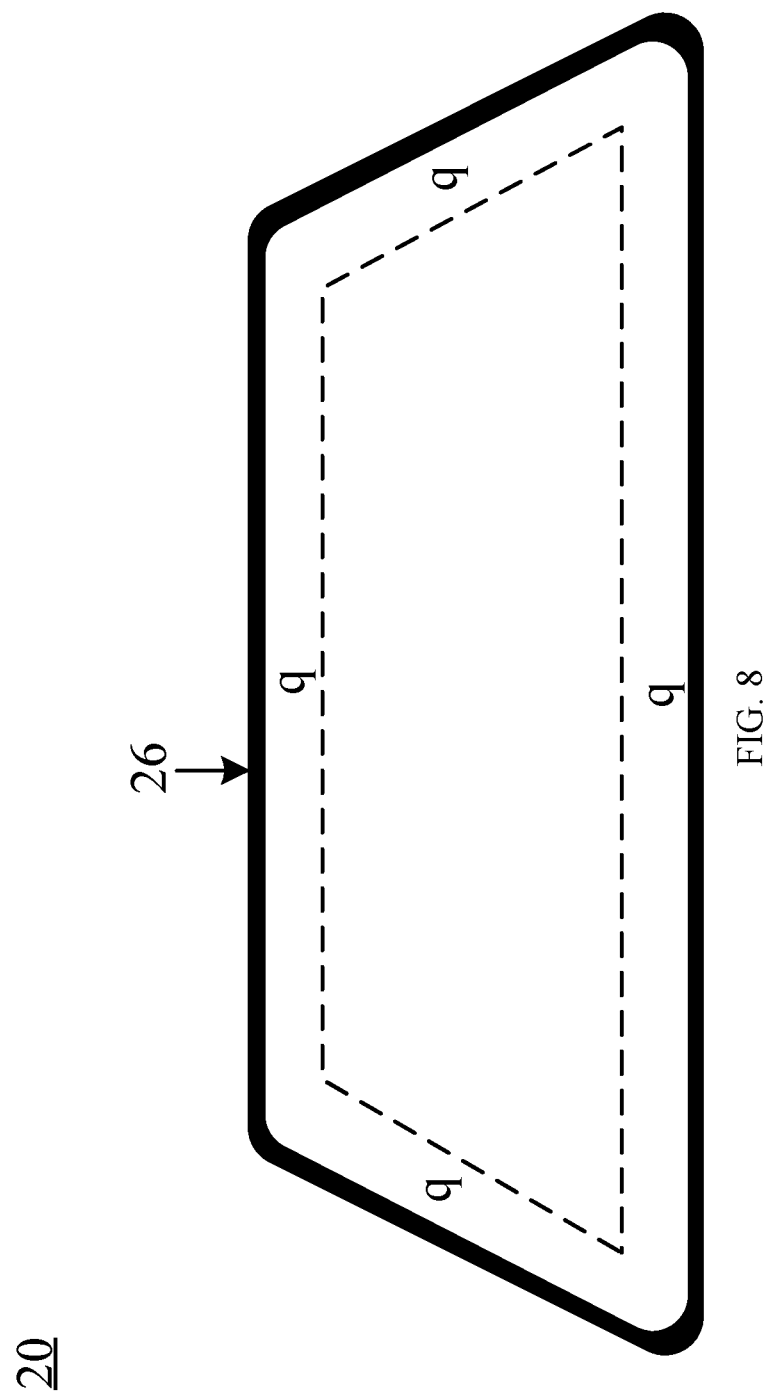
FIG. 8 is a top view of the display device shown in FIG. 6 or FIG. 7.

FIG. 8 is a top view of the display device 20 shown in FIG. 6 or FIG. 7. The region enclosed by the shielding block 26 may be a display region of the display panel 10.

Optionally, the side on which no light-emitting unit group is disposed, of the base substrate in the display panel 10 faces the inside of the vehicle. The light-exiting direction of the display panel 10 (i.e., the radiation direction of light emitted by the display panel) faces the outside of the vehicle. Thus, for people inside the vehicle, the display panel is equivalent to a piece of transparent glass. For people outside the car, the display panel may be taken as a display screen capable of displaying varied information. The display device 20 with this structure may be applied to the rear window of the vehicle.

Optionally, the display panel 10 includes a signal light region q configured to emit color light of a vehicle signal light. Thus, the display panel can achieve the function of the vehicle signal light.

Optionally, the signal light region q includes at least one signal sub-region. Each signal sub-region corresponds to one kind of vehicle signal light. The light-emitting unit in any signal sub-region of the at least one signal sub-region is a light-emitting unit configured to emit color light of the vehicle signal light that corresponds to the any signal sub-region.

The vehicle signal light that the signal sub-region corresponds to may include a location light, a brake light, a steering signal light, a rear fog light, a clearance light, etc. disposed at the tail of the vehicle. As each vehicle signal light usually corresponds to one kind of color light, only the light-emitting unit configured to emit one kind of color light may be disposed in each signal sub-region, to increase the amount of light-emitting units configured to emit this kind of color light in the signal sub-region, thereby improving the brightness of the color light that can be emitted by the signal sub-region. Exemplarily, when the color light that a vehicle signal light corresponds to is red color light, only the light-emitting unit configured to emit red light may be disposed in the signal sub-region that the vehicle signal light corresponds to. In comparison with a signal sub-region configured to emit varied kinds of color light, there may be more light-emitting units configured to emit red light in the signal sub-region in the present disclosure, and the brightness of the red light that can be emitted by the signal sub-region may be higher.

In addition, as shown in FIG. 8, the signal light region q may be at an edge of the display panel 10, and the signal sub-regions may be at varied positions of the signal light region q. Exemplarily, in FIG. 8, when one signal sub-region corresponds to the brake light, the signal sub-region may be in the signal light region q at the top edge, the signal light region q at the bottom edge or the signal light region q at the left or right edge of the display panel 10.

Optionally, each signal sub-region is provided with a passive drive component configured to drive the light-emitting unit in the signal sub-region. The passive drive component is a device that drives the light-emitting unit by means of the passive drive technology, and it adopts a relatively simple structure but has difficulty in precise control. The light-emitting units in each signal sub-region may be light-emitting units configured to emit the corresponding color light, and these light-emitting units are usually turned on or off simultaneously. Therefore, the light-emitting units in each signal sub-region may be driven by the passive drive component, to simplify the structure of the display panel. However, an active drive component may also be disposed in the signal sub-region, which is not limited in the embodiments of the present disclosure. Moreover, there may also be active drive components in other regions of the display panel to implement driving.

Optionally, the display device is applied to the front window of the vehicle. In this case, the side on which the light-emitting unit group is disposed, of the base substrate in the display panel 10 faces the inside of the vehicle. That is, the light-exiting direction of the display panel faces the inside of the vehicle. For people in the vehicle, the display panel may be taken as a head up display (HUP) and displays information, such as speed per hour, engine speed, fuel capacity and electric quantity. For people inside the vehicle, the display panel may be equivalent to a piece of transparent glass.

Figure 9:
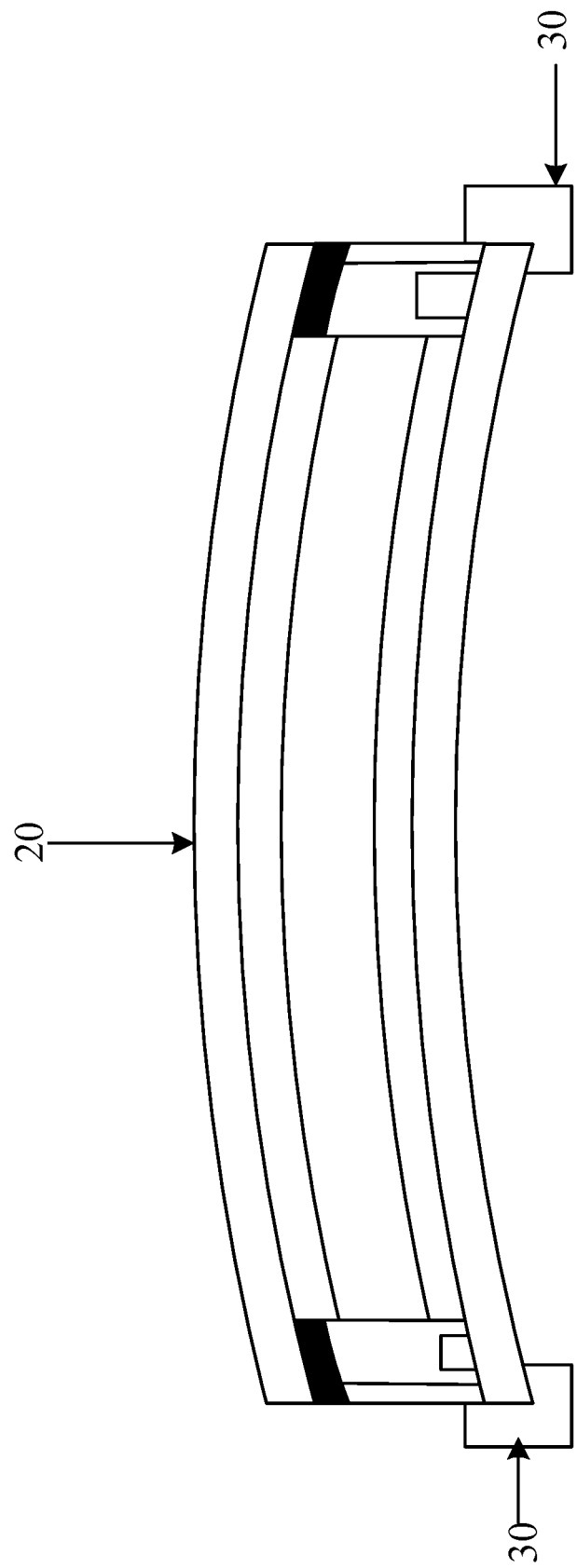
FIG. 9 is a schematic structural diagram of the display device shown in FIG. 7 when fixed with a clamping groove.

A clamping groove configured to place glass may be disposed in a frame of a vehicle body. Glass can be fixed on the vehicle body by coating adhesive glue in the clamping groove. The display device provided in the embodiment of the present disclosure may also be fixed on the frame of the vehicle body in this way. As shown in FIG. 9, the display device 20 and the clamping groove 30 are fixedly connected, and the clamping groove 30 may be fixed on the frame of the vehicle body.

In summary, according to the display device provided in the embodiment of the present disclosure, light emitted by the light-emitting unit can be viewed from one side of the display panel, and light emitted by the light-emitting unit cannot be emitted from this side due to shielding by the light-shielding layer. Since a light-transmitting region exists between the light-emitting unit groups, the other side of the display panel still has a transparent function. In this way, the display panel can be combined with varied transparent components. One side of the display panel plays a display function and the other side of the display panel is transparent, which solves the problem of a relatively single function of the display panel in the related art and diversifies the function of the display panel.

Figure 10:
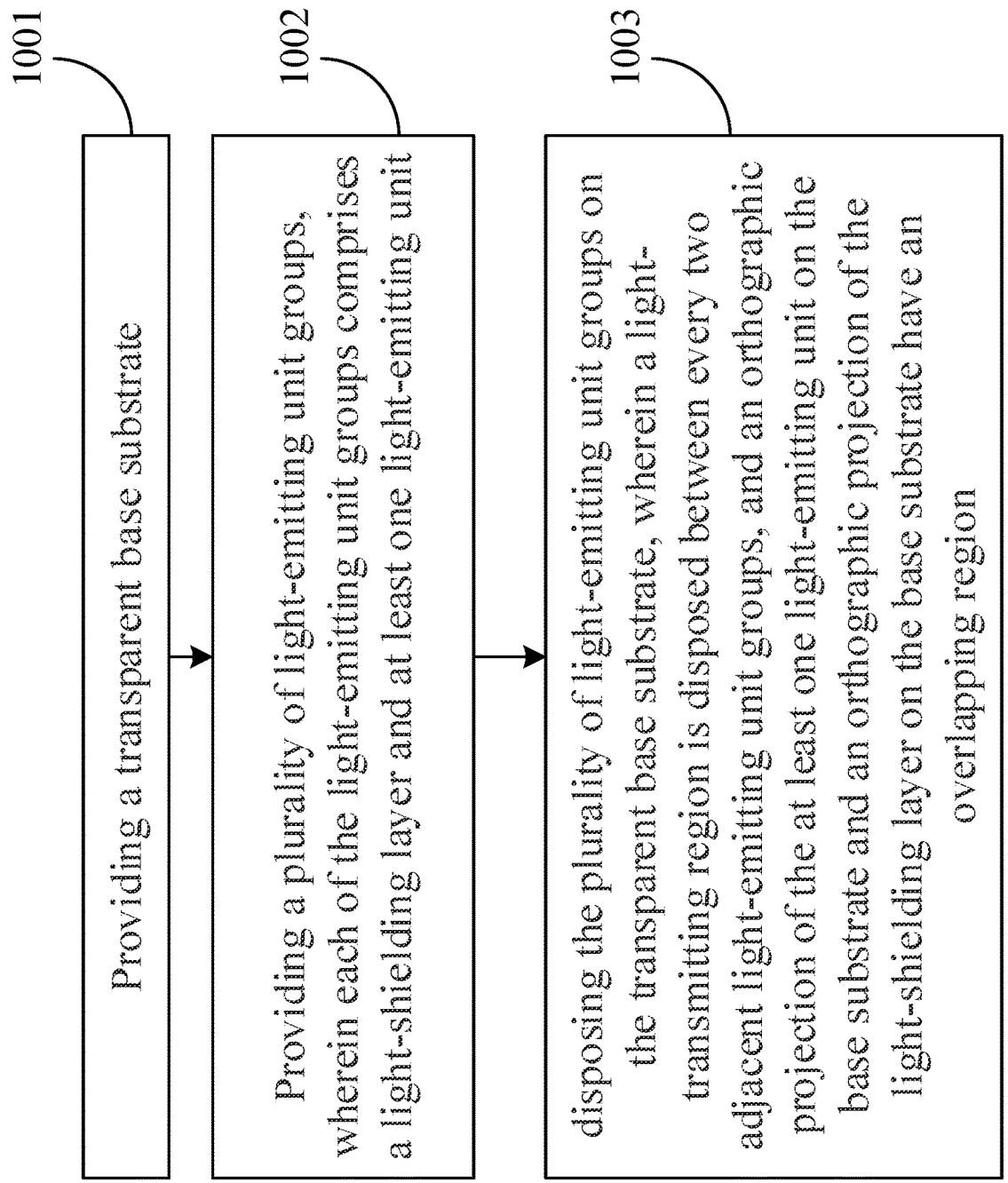
FIG. 10 is a flow chart of a manufacturing method of a display panel according to an embodiment of the present disclosure.

FIG. 10 is a flow chart of a manufacturing method of a display panel according to an embodiment of the present disclosure. The method can be applied to manufacture any of the display panels provided in the above embodiments. The method includes the following steps.

In step 1001, a transparent base substrate is provided.

In step 1002, a plurality of light-emitting unit groups is provided, wherein each of the light-emitting unit groups includes a light-shielding layer and at least one light-emitting unit.

In step 1003, the plurality of light-emitting unit groups is disposed on the transparent base substrate. A light-transmitting region is disposed between every two adjacent light-emitting unit groups. An orthographic projection of the at least one light-emitting unit on the base substrate and an orthographic projection of the light-shielding layer on the base substrate have an overlapping region.

In summary, a display panel may be manufactured according to the manufacturing method of the display panel provided in the embodiment of the present disclosure. Light emitted by the light-emitting unit can be viewed from one side of the display panel, and light emitted by the light-emitting unit cannot be emitted from this side due to shielding by the light-shielding layer. Since a light-transmitting region exists between the light-emitting unit groups, the other side of the display panel still has a transparent function. In this way, the display panel can be combined with varied transparent components. One side of the display panel plays a display function and the other side of the display panel is transparent, which solves the problem of the relatively single function of the display panel in the related art, and diversifies the function of the display panel.

It should be noted that in the drawings, the dimensions of layers and regions may be exaggerated for the clarity of illustration. It can also be understood that when an element or a layer is referred to as "on" another element or layer, the element or layer may be directly on the other element, or there may be an intermediate layer. In addition, it can be understood that when an element or a layer is referred to as "under" another element or layer, the element or layer may be directly under the other element, or there may be more than one intermediate layers or elements. Moreover, understandably, when a layer or an element is referred to as being "between" two layers or two elements, the layer or element may be the only layer between the two layers or the two elements, or there may be more than one intermediate layers or elements. Similar reference numerals indicate similar elements throughout the text.

The terms "first" and "second" in the present disclosure are merely used for description and cannot be construed as denoting or implying any relative importance. The term "a plurality of" means two or more, unless otherwise expressly specified.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:
1. A display panel, comprising:
a transparent base substrate; and
a plurality of light-emitting unit groups,
wherein the plurality of light-emitting unit groups is on the base substrate, a light-transmitting region is between every two adjacent light-emitting unit groups, each of the light-emitting unit groups comprises a light-shielding layer and at least one light-emitting unit, and an orthographic projection of the at least one light-emitting unit on the base substrate and an orthographic projection of the light-shielding layer on the base substrate have an overlapping region; and
wherein the orthographic projection of the at least one light-emitting unit on the base substrate is within the orthographic projection of the light-shielding layer on the base substrate.

2. The display panel according to claim 1, wherein the light-shielding layer is between the at least one light-emitting unit and the base substrate.

3. The display panel according to claim 1, wherein the light-shielding layer is at a side, away from the base substrate, of the at least one light-emitting unit.

4. The display panel according to claim 1, wherein the light-shielding layer is a reflective layer.

5. The display panel according to claim 1, wherein each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material.

6. The display panel according to claim 5, wherein in the first electrode and the second electrode, an electrode closer to the light-shielding layer adopts an integrated structure with the light-shielding layer.

7. The display panel according to claim 1, wherein each of the light-emitting unit groups comprises at least three light-emitting units, and the at least three light-emitting units form a pixel structure.

8. The display panel according to claim 1, wherein each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material and an electrode closer to the light-shielding layer is made from a light-shielding conductive material, and the light-shielding layer is a reflective layer; and the light-shielding layer is between the at least one light-emitting unit and the base substrate.

9. A display device, applied to a window of a vehicle and comprising two transparent cover plates and a display panel, wherein the display panel is between the two transparent cover plates and comprises a transparent base substrate and a plurality of light-emitting unit groups;

wherein the plurality of light-emitting unit groups is on the base substrate, a light-transmitting region is between every two adjacent light-emitting unit groups, each of the light-emitting unit groups comprises a light-shielding layer and at least one light-emitting unit, and an orthographic projection of the at least one light-emitting unit on the base substrate and an orthographic projection of the light-shielding layer on the base substrate have an overlapping region; and wherein the orthographic projection of the at least one light-emitting unit on the base substrate is within the orthographic projection of the light-shielding layer on the base substrate.

10. The display device according to claim 9, wherein the display device is applied to a rear window of the vehicle, and a light-exiting direction of the display panel is towards the outside of the car.

11. The display device according to claim 10, wherein the display panel comprises a signal light region, and a light-emitting unit in the signal light region is configured to emit color light of a vehicle signal light.

12. The display device according to claim 11, wherein the signal light region comprises at least one signal sub-region, wherein each signal sub-region corresponds to one kind of vehicle signal light, and the light-emitting unit in any signal sub-region of the at least one signal sub-region is a light-emitting unit configured to emit color light of a vehicle signal light that the any signal sub-region corresponds to.

13. The display device according to claim 12, wherein each signal sub-region is provided with a passive drive component configured to drive the light-emitting unit in the signal sub-region.

14. The display device according to claim 9, wherein the display device is applied to a front window of the vehicle, and a light-exiting direction of the display panel is towards the inside of the car.

15. The display device according to claim 9, comprising a signal receiver, wherein the signal receiver is connected to the display panel and configured to receive a control signal and control the display panel based on the control signal.

16. The display device according to claim 9, wherein the display device is applied to a side window.

17. The display device according to claim 9, wherein sealant surrounding the display panel is disposed between the two transparent cover plates; and the display device comprises a dehumidifier in a region surrounded by the sealant.

18. The display device according to claim 9, wherein in the display panel, each light-emitting unit comprises a first electrode, an organic light-emitting layer and a second electrode which are sequentially disposed in a direction away from the base substrate, and in the first electrode and the second electrode, an electrode farther from the light-shielding layer is made from a transparent conductive material and an electrode closer to the light-shielding layer is made from a light-shielding conductive material, and the light-shielding layer is a reflective layer; and the light-shielding layer is between the at least one light-emitting unit and the base substrate.

19. A manufacturing method of a display panel, comprising:

providing a transparent base substrate;

providing a plurality of light-emitting unit groups, wherein each of the light-emitting unit groups comprises a light-shielding layer and at least one light-emitting unit; and disposing the plurality of light-emitting unit groups on the transparent base substrate, wherein a light-transmitting region is disposed between every two adjacent light-emitting unit groups, and an orthographic projection of the at least one light-emitting unit on the base substrate and an orthographic projection of the light-shielding layer on the base substrate have an overlapping region; and wherein the orthographic projection of the at least one light-emitting unit on the base substrate is within the orthographic projection of the light-shielding layer on the base substrate.

* * * * *